United States Patent [19]

Butler et al.

[11] Patent Number: 5,385,634
[45] Date of Patent: Jan. 31, 1995

[54] SEALED SELF ALIGNED CONTACT PROCESS

[75] Inventors: Douglas Butler; E. Henry Stevens; Richard A. Bailey; Thomas C. Taylor, all of Colorado Springs, Colo.

[73] Assignees: Ramtron International Corporation, Colorado Springs, Colo.; Nippon Steel Semiconductor Corporation, Chiba, Japan

[21] Appl. No.: 43,569

[22] Filed: Apr. 7, 1993

Related U.S. Application Data

[60] Continuation of Ser. No. 701,211, May 16, 1991, abandoned, which is a division of Ser. No. 505,242, Apr. 5, 1990, Pat. No. 5,043,790.

[51] Int. Cl.⁶ ............................................. H01L 21/00
[52] U.S. Cl. ........................................ 156/644; 156/653; 156/657; 437/228
[58] Field of Search ............... 156/644, 651, 653, 656, 156/657, 661.1, 659.1; 437/190, 192, 195, 200, 203, 228, 52

[56] References Cited

U.S. PATENT DOCUMENTS

| | | | |
|---|---|---|---|
| 3,881,078 | 3/1989 | Tigelaar et al. | 357/54 |
| 4,556,897 | 12/1985 | Yorikane et al. | 357/71 |
| 4,570,331 | 2/1986 | Eaton, Jr. et al. | 437/41 |
| 4,686,000 | 2/1986 | Heath | 156/643 |
| 4,784,973 | 11/1988 | Stevens et al. | 437/200 |
| 4,826,781 | 5/1989 | Asahina et al. | 156/657 X |
| 4,857,141 | 8/1989 | Abe et al. | 156/644 |
| 4,878,994 | 11/1989 | Jucha et al. | 156/656 X |
| 4,897,709 | 1/1990 | Yokoyama et al. | 357/68 |
| 4,908,333 | 3/1990 | Shimokawa et al. | 437/195 |
| 4,921,572 | 5/1990 | Roche | 156/657 X |
| 5,010,032 | 4/1991 | Tang et al. | 437/200 X |
| 5,043,298 | 8/1991 | Yamada et al. | 437/52 |

FOREIGN PATENT DOCUMENTS

| | | | |
|---|---|---|---|
| 0232508 | 8/1989 | European Pat. Off. | H01L 21/60 |
| 0151476 | 8/1985 | Japan | H01L 29/54 |
| 880111026 | 11/1989 | Japan | H01L 21/88 |

OTHER PUBLICATIONS

Kusters et al, "A High Density 4Mbit dRAM Process Using a Fully Overlapping Bitline Contact (FOBIC) Trench Cell", Symp. VLSI Technical Digest, pp. 93–94 (1987).

*Primary Examiner*—Thi Dang
*Attorney, Agent, or Firm*—Edward D. Manzo; Mark J. Murphy

[57] ABSTRACT

In fabricating a contact window to source/drain electrode next to a gate electrode of an integrated circuit: (1) establishing a structure with a window over the source/drain region next to the gate electrode; (2) establishing a region of titanium silicide over the source/drain electrode and establishing a titanium nitride layer over the window and gate electrode; (3) establishing a layer of silicon nitride over the titanium nitride layer; (4) patterning the silicon nitride layer; (5) using the patterned silicon nitride layer as a mask to pattern the titanium nitride layer; (6) adding another silicon nitride layer to seal the gate electrode where it is not protected by titanium nitride; (7) opening a window over the electrode by an anisotropic etch; (8) widening the window with an isotropic etch, using the silicon nitride and titanium nitride as a protective barrier; and (9) adding contact material in said windows.

22 Claims, 1 Drawing Sheet

SEALED SELF ALIGNED CONTACT PROCESS

CROSS-REFERENCE

This is a continuation of application Ser. No. 07/701,211 filed May 16, 1991 as a division of application Ser. No. 07/505,242 filed Apr. 5, 1990, now U.S. Pat. No. 5,043,790 entitled "SEALED SELF ALIGNED CONTACTS USING TWO NITRIDES PROCESS", issued Aug. 27, 1991. Accordingly, the filing date of the grandparent application, Ser. No. 07/505,242, applies to this specification pursuant to the terms of 35 U.S.C. §120.

FIELD OF THE INVENTION

The present invention relates to fabrication processes for manufacturing transistors and other devices in integrated circuits, and particularly concerns the formation of contact windows to obtain improved step coverage despite small geometry design rules.

BACKGROUND OF THE INVENTION

While the present invention is not limited to field effect transistors, and may find application in bipolar, CMOS, or other semiconductor technology, reference will be made to field effect transistors, often referred to as MOS transistors. Fundamentally, MOS transistors generally include highly doped regions called sources and drains in a semiconductor surface, having a gate region or channel between the source and drain regions. A gate electrode is located above and in use is electrically biased from time to time to form or eliminate the channel. MOS transistors are separated from nearby transistors or other devices by an isolation technique. Two prevalent isolation techniques are the use of a thick field oxide or a field shield. The field shield approach is disclosed, for example, in U.S. Pat. No. 4,570,331, entitled "THICK OXIDE FIELD-SHIELD CMOS PROCESS," issued on Feb. 18, 1986 to INMOS Corporation upon the application of S. Sheffield Eaton, Jr. and Cheng-Cheng Hu.

In addition to isolating the transistor, connections are usually made to the source, drain and gate of the transistor. Integrated circuits generally further include a thick interlevel dielectric which is added on top of the transistor structure. After the thick dielectric is in place, at some time contact windows are etched to allow contacts to be made to the transistor source, drain and gate electrode. When very small geometries are used, the contact window tends to have an "aspect ratio" (height divided by base) that becomes too large (i.e. greater than 0.5), resulting in poor step coverage by a sputtered or evaporated conductor. The narrow "base" dimension (such as the width of a source/drain region) is small because of the small geometries, though the thickness of interlevel dielectric remains relatively large. In consequence, a main object of the present invention is to provide a structure and process which protects elements of the transistor from such dangers of etching and simultaneously allows larger windows to be constructed even in small geometries.

It will be understood that a preferred form of the invention involves the use of a titanium nitride (TIN) layer covering a titanium silicide (TiSi$_2$) region that is found in the contact area. This part of the combination is known to the semiconductor industry, and reference may be had to Stevens, McClure and Hill, U.S. Pat. No. 4,784,973 issued on Nov. 15, 1988 to INMOS Corporation, entitled "SEMICONDUCTOR CONTACT SILICIDE/NITRIDE PROCESS WITH CONTROL FOR SILICIDE THICKNESS." That patent explains also that titanium nitride can be used as a metallurgic barrier against reactions between a silicon substrate and an aluminum contact material to a source or drain, for example. The '973 patent discloses a process using a control layer located in the contact opening and formed illustratively of a compound of silicon, oxygen and nitrogen, or silicon oxide. A layer of titanium is added, and titanium silicide is formed under the control layer, and titanium nitride is formed above the control layer. It may also be noted, however, that the titanium is added after a relatively thick layer of dielectric such as BPSG is established.

By way of further background, an application of the combination of titanium nitride with titanium silicide is discussed by Tang, Wei, Haken, Holloway, Wan and Douglas in "VLSI Local Interconnect Level Using Titanium Nitride," *International Electron Devices Meeting* 1985 (IEDM 85), pp. 590-93. Tang et al. use the titanium nitride for local interconnects.

The present invention has further aspects, however, than merely locating a titanium nitride layer over the contact area. These further aspects are discussed infra.

SUMMARY OF THE INVENTION

The present invention has many aspects which will be understood from studying the description of the preferred embodiment, infra. However, it may generally be stated that according to some aspects of the invention, a layer of a transition metal nitride, preferably titanium nitride (TIN), is formed over the transistor source, gate electrode, and drain regions. Preferably, a blanket layer of titanium nitride is formed which covers the top and sides of the dielectric insulated gate electrode, and the bottom and side walls of the openings for the source and drain regions. Where field shield isolation is provided, the nitride layer also preferably extends over the top surface of the field shield isolation transistors. This nitride Layer is one element of a composite nitride structure.

A second element of the composite nitride structure used in the present invention is a second nitride layer formed on top off the first nitride layer. Preferably, the second nitride layer is formed directly on top of and in contact with the first nitride layer. Preferably the second nitride layer comprises or constitutes silicon nitride. Thus, a two layer composite structure is formed—at least temporarily—on the side walls and preferably extends over the gate electrode. A spacer will be provided between the gate electrode sidewall and the first layer, and the spacer may comprise a dielectric such as silicon dioxide or silicon nitride. Preferably the composite is added prior to establishing a relatively thick interlevel dielectric over the environs.

The composite structure may include a third layer which is located only where the composite traverses a source or drain region. Thus, a third layer, preferably titanium silicide, is created as a lowermost layer. Typically, the titanium silicide will form in the substrate itself extending downward from the top surface of the substrate in the designated source/drain region, and extend into the substrate (but not nearly as far as the source/drain region extends into the substrate).

One beneficial effect of the second nitride layer, preferably silicon nitride, is to prevent oxidation of the first nitride layer. Prevention of oxidation occurs where the second nitride layer is silicon nitride and the first nitride layer is titanium nitride. A further advantage of this combination is that in the process flow, the second nitride layer is patterned without affecting or defining the first nitride layer. In a subsequent step, the patterned second nitride layer is used to replicate its own pattern in the first nitride layer. The second nitride layer can now be removed, or removal can occur later in the process.

Next, a further layer of a nitride is deposited over the region and covers the top of the existing one or two nitride layers. Then a relatively thick dielectric may be added. At some time thereafter, contact windows to the source/drain regions can be defined and etched anisotropically. The presence of the TiN structure over the gate electrode or field shield will prevent the dielectric from being removed from these regions during the contact window etching where the contact window overlaps these regions. This will prevent undesired electrical contact between source/drain and gate or field shield.

Next, the contact window in the thick dielectric is widened, preferably using a wet etch process before the photoresist is removed. The wet etch preferably does not appreciably etch the photoresist, the first nitride layer or the further nitride. Thus, the composite structure prevents the wet etch from etching to the gate or field shield electrodes thereby to prevent creating unwanted electrical contact. The widened window allows a wider self-aligned contact that will not short to the gate electrode or a field shield electrode. Better coverage by the deposited metal of the step from the thick dielectric surface to the source, drain or gate electrode contacts results from this procedure.

BRIEF DESCRIPTION OF THE DRAWINGS

In describing a preferred embodiment of the present invention, reference is made to the accompanying drawings wherein.

DETAILED DESCRIPTION OF THE PRESENTLY PREFERRED EMBODIMENTS

Figure 1:
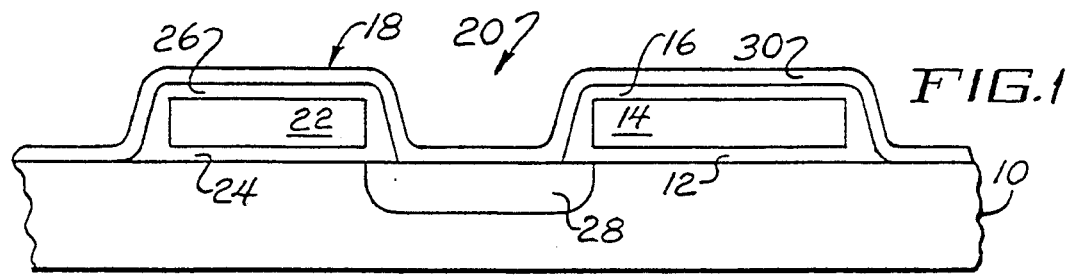
FIG. 1 represents a sectional view (not to scale) of a partially formed transistor next to a field-shield isolation transistor structure in an integrated circuit, in a process according to the present invention.

Referring to FIG. 1, part of a field effect MOS transistor (on the left) next to a field shield isolation transistor portion (on the right) is depicted in a sectional representation. This view represents an intermediate step during formation of the integrated circuit. As shown, a substrate 10 is a semiconductor wafer, preferably of a suitably doped single crystal silicon. It will be understood that the silicon can be lightly doped. Further, an expitaxial layer can be included. Substrate 10 is intended to be representative as are other portions of the transistor. A dielectric 12 is preferably silicon oxide having a thickness on the order of 0.05 to 0.1 microns deposited upon or grown upon the top surface of substrate 10. Above oxide 12 is a field shield gate electrode 14 which is preferably polycrystalline silicon ("polysilicon") having a thickness typically on the order of 0.1 to 0.4 microns. A dielectric 16 is shown above and in contact with the field shield gate electrode 14. Dielectric 16 is formed illustratively of silicon oxide or silicon nitride and has a thickness on the order of 0.1 to 0.3 microns. These structures provide a field shield isolation transistor so that the gate electrode thereof can be grounded to turn the field shield isolation transistor off. It will be understood that field oxide could be used instead of the superior field-shield technique. In general, the element next to the region to which contact is to be made is not limited by the present invention—and may comprise isolation or other structures.

As mentioned, the MOS transistor is formed to the left of the exemplary field shield isolation transistor gate electrode 14. Accordingly, a gate electrode general structure 18 is shown at the left of FIG. 1. Between gate electrode structure 18 and field shield electrode 14 is a region 20. Gate electrode structure 18 comprises a gate electrode 22 preferably formed of doped polysilicon. Beneath electrode 22 is a relatively thin dielectric 24, usually silicon oxide having a thickness on the order of 0.015 through 0.03 microns. Dielectric 24 isolates gate electrode 22 from the upper surface of substrate 10. On the top and sides of gate electrode 22 is a further dielectric 26 formed preferably of silicon oxide or silicon nitride having a thickness on the order illustratively of between 0.15 and 0.4 microns. Further elements may be included in the gate electrode structure 18.

A source/drain region 28 is shown beneath region 20. It is formed by dopants that have been introduced by implantation preferably, or by other methods such as diffusion. Preferably, source/drain region 28 is doped to a concentration in the range of $10^{17}$ to $10^{18}$ ions per cubic centimeter, or more.

Next, a layer 30 of a transition metal, preferably titanium, is deposited or otherwise established over a first region which comprises the entire structure of FIG. 1. This can be added by sputtering, for example, to a thickness nominally of 0.02 microns. This results in the structure of FIG. 1.

Figure 2:
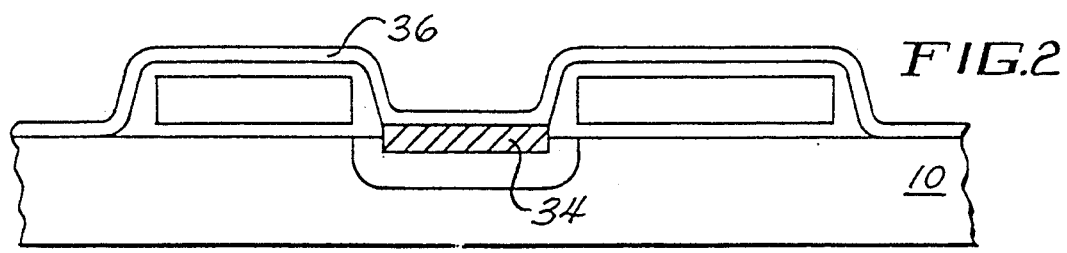
FIG. 2 illustrates the structure of FIG. 1 at a subsequent processing stage after a first nitride layer has been formed, and after a silicide region has been formed in the source/drain region.

The structure of FIG. 1 is then annealed or reacted at an elevated temperature in a nitrogen-containing atmosphere. Illustratively, this step may occur at a temperature of 550° C. in an atmosphere of nitrogen, ammonia, or $N_2+H_2$. The oxygen content of the ambient atmosphere is preferably kept extremely low. Consequently, where the titanium contacts the source/drain region, it reacts with the silicon of substrate 10 to form a conductive titanium silicide region 34 (FIG. 2). The titanium layer also forms a titanium nitride layer 36 above the titanium silicide region 34 and in all other areas where the titanium was deposited (a "first region"). It will be noted that the titanium nitride layer is thinner over the source/drain regions than elsewhere because part of the titanium in those regions has reacted with the silicon of the substrate 10. After reacting with the titanium layer 30, the titanium nitride layer 36 can be made thicker if desired by a second titanium deposition followed by annealing or a reaction in a nitrogen-containing atmosphere, or by reactively sputtering titanium in a chamber containing nitrogen ions. Preferably, the ultimate thickness of TiN layer 36 is in the range of 0.03 to 0.1 microns, and the thickness of silicide region 34 is in the range of 0.012 to 0.2 microns. This is the structure shown in FIG. 2.

Next a second nitride layer 40 is deposited or otherwise established on top of the first nitride layer 36. Preferably, the second nitride layer 40 (not shown in FIG. 2) is formed of silicon nitride having a thickness illustratively of about 0.02 to 0.1 microns. This is established conveniently by a chemical vapor deposition of silicon nitride. Layer 40 or portions thereof are sometimes referred to as the "upper nitride layers."

Figure 3:
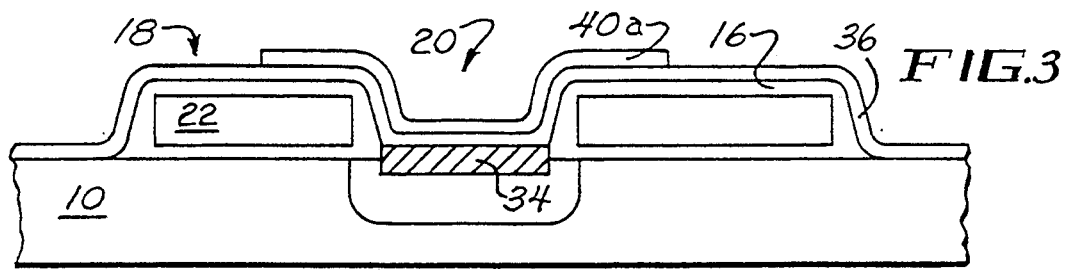
FIG. 3 illustrates the structure of FIG. 2 after a second nitride layer has been added and defined.

The structure of FIG. 2 is now processed using well known photolithographic and etching procedures so that the second nitride layer is patterned to leave a portion 40a over the region 20 as shown in FIG. 3. It will be seen that portion 40a of the upper nitride layer which remains after the etch covers the bottom and side walls of region 20, as well as adjacent portions of the horizontal surfaces next to the windows. More precisely, after this patterning step, portion 40a of the upper nitride layer will still be located over part of dielectric 16 and will partially cover gate electrode structure 18. After defining the pattern for portion 40a in a photoresist layer (not shown), the upper nitride layer can be etched in a plasma comprising carbon tetrafluoride, oxygen, and nitrogen in the approximate ratio of 2:1:3. To avoid leaving unwanted filaments along the vertical side walls of the windows, the silicon nitride etch is preferably isotropic or nearly isotropic. The structure of FIG. 3 results.

Figure 4:
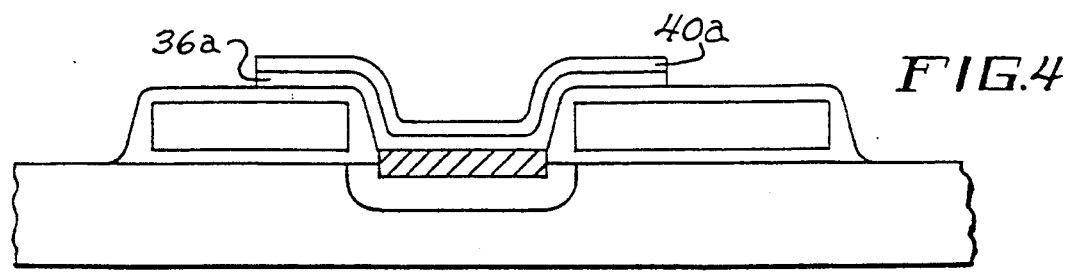
FIG. 4 illustrates the structure of FIG. 3 after the exposed portions of the first nitride layer have been etched away.

After patterning the silicon nitride layer to create portion 40a, the exposed portions of the first or lower (titanium) nitride layer 36 can be removed using a wet etch illustratively comprising a solution of ammonium hydroxide, hydrogen peroxide, and water. The portion 40a of the silicon nitride layer acts as a mask to protect underlying parts 36a of the lower nitride layer 36 in and near region 20. This results in the structure shown in FIG. 4, which shows TiN portion 36a substantially coextensive with silicon nitride portion 40a.

Figure 5:
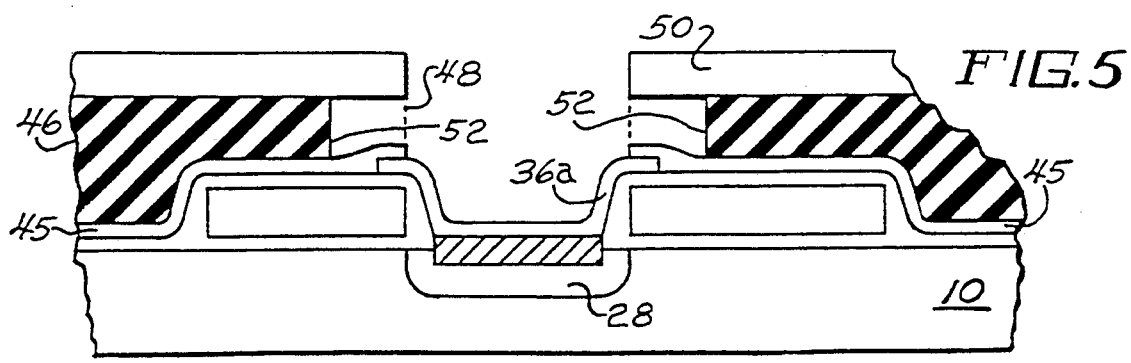
FIG. 5 illustrates the structure of FIG. 4 after a further layer of nitride and an interlevel dielectric has been added, and contact windows have been etched to the source/drain region. The subsequent etch result is then shown.

Turning now to FIG. 5, after etching away the exposed portions of lower nitride layer 36, the silicon nitride portion 40a can be removed. Optionally, it may be left in place. Next, a further nitride layer 45, preferably comprising silicon nitride, is deposited using CVD or any other effective process. This further silicon nitride layer illustratively has a thickness of 0.1 microns, and covers the entire region. This further layer will cover the gate electrode structure 18 and thus seal it.

Next, a thick dielectric layer 46 is deposited over the entire region and flowed smooth to planarize the topography by a thermal cycle preferably of between 850° C. and 920° C. at a duration of between about 5 minutes and 20 minutes in an atmosphere containing oxygen or water vapor. Preferably, the thick dielectric layer comprises silicon dioxide doped with phosphorus, phosphorus and boron, or arsenic at suitable concentrations.

A photoresist 50 is placed on top of the thick dielectric and patterned as shown in FIG. 5. The thick dielectric layer 46 now may be etched preferably anisotropically using fluorocarbons or chlorocarbons for example to expose layer 36a which is electrically connected via silicide region 34 to the source/drain region 28 to which contact is to be made. The side walls resulting from this etch are represented by broken lines 48. It will be seen that side walls 48 terminate on the top surface of the titanium nitride layer portion 36a. A portion 46 of the thick dielectric layer remains on top of the field-shield isolation structure, and a portion 46 remains on top of the gate electrode structure 18. The space between side walls 48 will often be less than 1 micron. It can have a square, rectangular, or circular opening in plan view.

To improve seep coverage of a subsequent metal (or other conductor) deposition by sputtering or evaporation, the next stem in the process is to widen the contact window. This is preferably achieved before photoresist 50 is removed. A wet etch process is used which will not etch photoresist 50, titanium nitride portion 36a, or silicon nitride 45, but is selective to etch the thick dielectric 46. An aqueous buffered HF solution is suitable.

The window widens in proportion to etch time to result in new side walls 52 which, after an etch of nominally one to five minutes, can be 0.1 to 0.2 microns wider on each side of the window than before the wet etch occurred. The photoresist 50 is preferably left in place to serve as a control to protect against any thinning of dielectric 46 where it should be preserved during this etch, and is removed later.

As a result, a wider contact window in the thick dielectric is created that will not short to the gate electrode 22 or field shield electrode 14, since those elements are sealed by a combination of layers—titanium nitride layer portion 36a and silicon nitride 45. This allows improved step coverage without changing the underlying design rules.

It will be understood further that this window is self aligned because the titanium nitride protects the gate electrodes 14, 22 if the window is not exactly aligned to the source, drain or gate electrode contact.

Electrical connections to the source/drain region 28 can now be made through the contact window using interconnect lines of metal, a metal silicide, a doped polycrystalline silicon, or other conductor.

While the preferred embodiment has been described herein, it will be apparent that various modifications can be made within the scope and spirit of the present invention which is defined by the following claims.

We claim:

1. In the fabrication of an integrated circuit transistor having an electrode to which electrical contact is to be made, the electrode being proximate to other structure of the integrated circuit, a process comprising the steps of:

forming a first conductive nitride layer over a first region that includes the electrode and the other structure such that said first conductive nitride layer is in electrical contact with the electrode and isolated from the other structure;

forming a second nitride layer over said first conductive nitride layer;

patterning said second nitride layer to leave second nitride portions over said electrode and a part of said other structure;

patterning said first conductive nitride layer using said second nitride portions as a mask;

adding a further layer of nitride to cover said other structure, said first conductive nitride layer and said second nitride layer;

adding a relatively thick insulation over said further layer of nitride;

anisotropically etching said insulation and said further layer of nitride to open a window to a portion of said first conductive nitride layer over said electrode; and etching said insulation in said window isotropically to widen the window, said nitride layers protecting said other structure from being exposed during said etch, whereby an electrically conductive material can be placed in said widened window to become electrically coupled to said electrode with improved step coverage.

2. The process of claim 1 further including the step of forming a third layer between said electrode and said first conductive nitride layer by contacting and reacting a transition metal with said electrode.

3. The process of claim 1 wherein said first conductive nitride layer comprises a transition metal nitride compound, and wherein said second nitride layer and said further layer of nitride are dielectrics.

4. The process of claim 3 wherein said first conductive nitride layer comprises titanium nitride.

5. The process of claim 3 wherein said second and further layer of nitride comprise silicon nitride.

6. The process of claim 4 further including the step of forming a titanium silicide region above said electrode, said titanium silicide being located below said titanium nitride layer.

7. The process of claim 6 wherein said step of etching isotropically includes leaving a protective layer above said thick insulation.

8. In the fabrication of an integrated circuit transistor, a process for establishing a contact to a source/drain electrode next to another structure in an integrated circuit to which contact is not to be made, said integrated circuit having a region having side walls and a bottom, said electrode being located at the bottom of said region, comprising the steps of:

forming a layer of titanium nitride on side walls of said region, the bottom of said region, and above said another structure;

forming a layer of titanium silicide at the bottom of said region beneath said titanium nitride;

forming a layer of silicon nitride over said titanium nitride layer;

patterning said silicon nitride layer to leave portions thereof within the region and extending over part of said other structure; then patterning said titanium nitride layer using said patterned silicon nitride as a mask;

adding a second silicon nitride layer over said other structure;

adding a relatively thick dielectric material over said region, said other structure, said titanium nitride and said second silicon nitride layers;

opening a window in said thick dielectric over said electrode region, said opening step comprising a sequence of an anisotropic etch followed by an isotropic etch; and subsequently placing an electrically conductive material in said window to become electrically coupled to said source/drain electrode.

9. The method of claim 8 wherein said step of opening a window includes placing a protective layer above said thick dielectric, and wherein protective layer is left in place during both said anisotropic and said isotropic etch sequence.

10. The process of claim 1 further including the step of removing said second nitride layer after patterning said first conductive nitride layer.

11. The process of claim 1 wherein said first conductive nitride layer is effective as a dry etch stop and a wet etch stop.

12. The process of claim 8 wherein said titanium nitride layer is effective as a dry etch stop and a wet etch stop.

13. The process of claim 8 further comprising the step of forming a second layer of titanium nitride over said layer of titanium nitride.

14. In the fabrication of an integrated circuit transistor having an electrode to which electrical contact is to be made, the electrode being proximate to another structure of the integrated circuit, the process comprising the steps of:

establishing a first nitride layer that completely covers said electrode and overlies a first region that includes said electrode and said other structure, said first nitride layer and said electrode being formed by in-situ reaction of a deposited transition metal followed by reactive-sputtered deposition of titanium nitride;

establishing a second nitride layer over said first nitride layer;

patterning said second nitride layer and subsequently patterning said first nitride layer using said second nitride layer as a mask;

adding an additional nitride layer, said additional nitride layer and said second nitride layer providing oxidation protection for said first nitride layer;

adding a thick dielectric layer over said first region and said nitride layers;

performing a high temperature reflow anneal in an oxidizing ambient;

etching said thick dielectric layer and said second and additional nitride layers to open a window over said electrode and stopping on said first nitride layer, so that a contact material can be placed in said window to become electrically coupled to said electrode.

15. The process of claim 14 wherein said second nitride and additional nitride layers are comprised of silicon nitride having a thickness in the range of approximately 0.02 to 0.1 microns.

16. The process of claim 14 wherein said deposited transition metal is deposited titanium having a thickness of approximately 0.02 microns in-situ reacted to form a compound selected from a group comprising titanium nitride, and titanium nitride and titanium silicide.

17. The process of claim 14 further comprising the step of establishing a titanium silicide region at said electrode, said titanium silicide region being located below said titanium nitride, wherein said titanium nitride seals said titanium silicide in said electrode, said electrode being capable of a high temperature anneal process without significant degradation of the electrical contact resistance.

18. The process of claim 16 further comprising the step of establishing a titanium silicide region at said electrode, said titanium silicide region being located below said titanium nitride, wherein said titanium nitride seals said titanium silicide in said electrode, said electrode being capable of a high temperature anneal process without significant degradation of the electrical contact resistance.

19. The process of claim 14 wherein said patterning of said second nitride layer comprises plasma etching using a reaction species of carbon tetrafluoride, oxygen and nitrogen as an isotropic etch for sidewall stick removal with minimal dimension loss.

20. The process of claim 15 wherein said patterning of said second nitride layer comprises plasma etching using a reaction species of carbon tetrafluoride, oxygen and nitrogen as an isotropic etch for sidewall stick removal with minimal dimension loss.

21. The process of claim 14 wherein said patterning of said second nitride layer comprises using a wet etch solution of ammonium hydroxide, hydrogen peroxide, and water or dilute sulfuric acid.

22. The process of claim 14 further comprising the step of etching said thick dielectric in said window isotropically to widen the window, said nitride layers protecting said other structure from being exposed during said etch, whereby a contact material can be placed in said widened window to become electrically coupled to said electrode with improved step coverage.

* * * * *